United States Patent [19]

Johnson

[11] Patent Number: 4,647,872
[45] Date of Patent: Mar. 3, 1987

[54] CASCODE AMPLIFIER

[76] Inventor: William Z. Johnson, 5700 Tucker La., Edina, Minn. 55436

[21] Appl. No.: 759,582

[22] Filed: Jul. 25, 1985

[51] Int. Cl.$^4$ .............................................. H03F 3/68
[52] U.S. Cl. .................................. 330/311; 330/296; 330/98
[58] Field of Search .................. 330/98, 296, 310, 311

[56] References Cited

U.S. PATENT DOCUMENTS

| | | |
|---|---|---|
| 2,423,362 | 7/1947 | Banker . |
| 2,874,234 | 2/1959 | Parker . |
| 2,922,115 | 1/1960 | Swain . |
| 3,286,189 | 11/1960 | Mitchell et al. . |
| 3,292,013 | 12/1966 | Golahny . |
| 3,449,683 | 6/1969 | Gane . |
| 3,449,686 | 6/1969 | Bladen . |
| 4,071,830 | 1/1978 | Huntington .......................... 330/311 |
| 4,110,641 | 8/1978 | Payne .................................. 330/257 |

OTHER PUBLICATIONS

M. H. El-Diwany et al., "Design of Low-Noise Bipolar Transimpedance Preamplifiers for Optical Receivers, IEE Pro., vol. 128, Pt. G, No. 6, Dec. 1981, pp. 299–301.

*Primary Examiner*—Gene Wan
*Attorney, Agent, or Firm*—Merchant, Gould, Smith, Edell, Welter & Schmidt

[57] ABSTRACT

A stabilized Cascode Amplifier Circuit wherein the grid or gate control of the second stage of the cascaded input is provided by feedback of a portion of the output signal voltage. The circuit can be further enhanced by the inclusion of a unity gain follower between the first and third stage of the cascode amplifier circuit.

7 Claims, 5 Drawing Figures

CASCODE AMPLIFIER

DESCRIPTION

Background of the Invention

This invention relates to electronic amplifier circuits, and more particularly to cascode amplifier circuits for high fidelity audio signal amplification.

The basic cascode circuit has long been a favorite choice for input stages of amplifiers because of its simplicity, high gain and low noise characteristics. Its name is derived from "cascade-cathode" in which one part follows another in cascade but with the output of the first connected directly to the cathode of the second part. The name "cascode" is even commonly used for transistor circuits in which there are no cathodes.

Although the cascode circuit has several advantages, it has some significant limitations, especially when used in very high quality audio amplifiers or preamplifiers. In these high performance applications, the signal linearity (lack of signal distortion), wide bandwidth and freedom from noise and drift due to aging or other disturbances becomes very important.

SUMMARY OF THE INVENTION

The present invention is a cascode amplifier circuit in which the bias voltage fo the cascode input is taken from the output resistor. This results in a simpler circuit structure having fewer power supply components and a surprising increase in performance. Distortion is reduced to 50% or less of that of conventional cascode amplifier circuits. The circuit has lower noise, wider bandwidth and greater gain and phase stability than existing cascode amplifier circuits. In a preferred embodiment a unity gain follower can be directly coupled between the first and second stages of the cascode input circuit to offer further improvements in performance.

BRIEF DESCRIPTION OF THE FIGURES

A detailed description of the preferred embodiments of the Cascode Amplifier is hereafter described with specific reference being made to the drawings in which.

DESCRIPTION OF THE PREFERRED EMBODIMENTS

Figure 1:
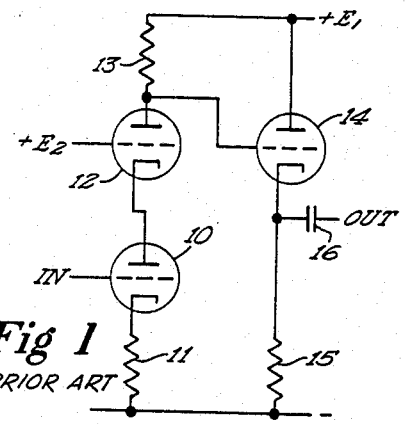
FIG. 1 is a circuit schematic of the prior art.

FIG. 1 is illustrative of the current art of cascode amplifiers, the one shown having a cathode follower output. In the current art an input signal is received by triode 10 which has its output connected directly to the cathode of triode 12. The output of triode 12 is made directly to the grid of the third amplifier stage triode 14. The output from the circuit is made across a cathode follower resistor 15 from which the circuit output is taken through capacitor 16. Power is supplied to the circuit by power supply E1 through load resistor 13. Biasing resistor 11 ensures proper operation of triode 10. A separate bias power supply E2 is needed to control the input bias of the second stage triode 12.

Throughout this specification a circuit stage will refer to an amplifier stage made up of an electronic control valve and its associated biasing or load resistors. The electronic control valves used in this circuit are normally three element devices. Inputs and outputs from electronic devices need to use at least two device terminals. For simplication inputs and outputs from three terminal devices are usually called out without labeling the actual terminal connections.

Figure 2:
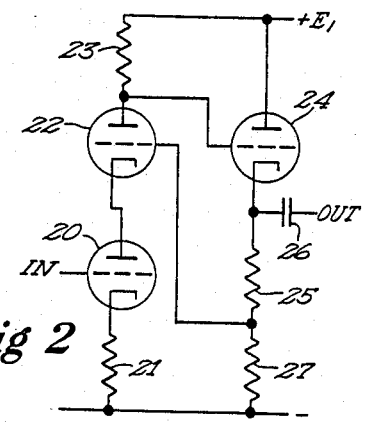
FIG. 2 is a circuit schematic of the present invention.

The present invention is shown in FIG. 2. An input signal is received by triode 20 whose output taken from its plate is cascaded with the cathode of triode 22. The output of triode 22 is used to control the grid of the third stage triode 24. The circuit output is taken across the cathode follower resistors 25 and 27 through capacitor 26. Power to the circuit is provided by power supply E1. Biasing is provided to the second stage, triode 22, by taking a portion of the circuit output signal from the cathode follower resistors. Resistors 25 and 27 act as a voltage divider to provide a portion of the output voltage to triode 22. By employing a cathode follower for impedance conversion into the circuit, it is very simple to split the load resistor into two parts and connect that junction to the input to the second stage of the cascode input triodes. This feedback loop puts a signal on the grid of the second triode that is out of phase with the input signal resulting in error cancellation. Typically ¼ to 1/6 of the output voltage is fed back.

This stabilized cascode amplifier circuit offers many advantages. The circuit eliminates the need for a separate bias power supply for the second stage of the cascode amplifier input. Distortion is reduced to 50% or less over the conventional prior art cascode amplifier without a corresponding amount of reduction in signal gain. This is achieved because the stabilized cascode circuit reduces the gain of the second stage which in turn results in increased gain of the first stage of the cascode input circuit due to increased load impedance for the first stage input triode. This is advantageous because the signal levels are higher in the second stage and the need for reduction of distortion is greater. By increasing the gain of the first stage of the cascode input the increased signal level overrides the noise produced by the second part of the cascode input to a greater degree. The stabilized cascode circuit is no longer subject to the frequency dependent characteristics or drift of the power supply connected to the grid of the second stage of the conventional cascode amplifier circuit. Furthermore, the conventional technique of lowering noise by using the very large plate load resistance for the second stage is no longer necessary, thereby extending the high frequency bandwidth. The introduction of negative feedback used in the stabilized cascode circuit amplifier extends to direct current, and no troublesome low frequency phase shifts are introduced. The effects of tube aging are largely compensated for by the negative feedback.

Figure 3:
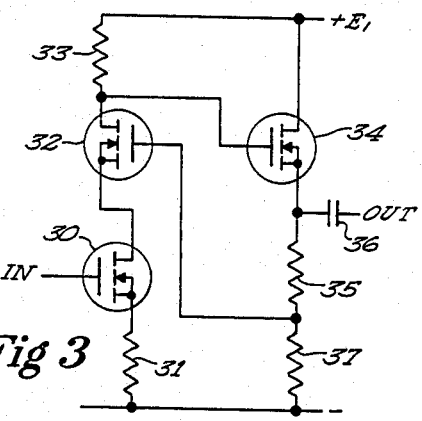
FIG. 3 is a circuit schematic of an alternative embodiment of the present invention.
Figure 4:
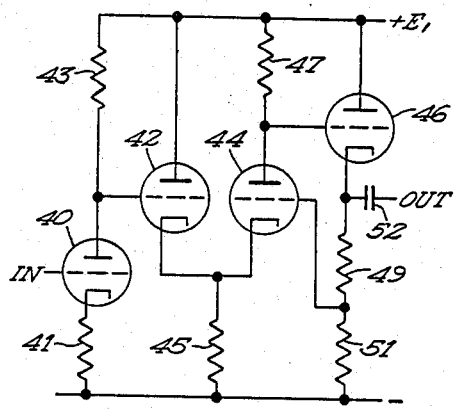
FIG. 4 is a circuit schematic of a third embodiment of the present invention.

While vacuum tubes are used in audio amplification for historical and audio fidelity reasons, transistors can also be used to implement the present invention. FIG. 3 shows the present invention implemented using n-channel enhancement mode MOS field effect transistors. Input signals are received by transistor 30. The output of this first stage transistor is connected from its drain to the source of the second stage transistor 32. The output of transistor 32 is connected to the gate of transistor 34. The circuit's amplified signal out is taken through capacitor 36 and across the combination of source follower resistors 35 and 37. The gate of transistor 32, the second stage transistor of the cascaded input, is biased by a voltage taken from the voltage divider formed by source follower resistors 35 and 37. Bias resistor 31 and load resistor 33 are chosen to ensure proper transistor operation of the cascaded input transistors. The field effect transistor version of the present invention operates as a direct replacement to the triode version.

A third embodiment of the present invention includes the addition of an impedance converter or a unity gain follower directly coupled between the first and second stages of the disclosed cascode amplifier circuit. In this circuit design the input signal is received by the first stage made up of triode 40 biased to an appropriate operating point by resistor 41. Theoutput of triode 40 controls the grid of a second stage buffer triode 42 which has a load resistor 45. The cathode of the buffer triode 42 is connected to the cathode of triode 44 which forms the third stage of the cascode amplifier circuit. Triode 44 has a load resistor 47 and its output is used to control the grid of the fourth stage consisting of triode 46 and resistors 49 and 51. The amplified circuit signal out is taken through capacitor 52 with the cathode follower resistor divided into two parts 49 and 51 to form a voltage divider. A portion of the circuit's output signal is used to control the grid of the third stage triode 44.

The circuit operates similar to the embodiment as discussed with reference to FIG. 2 with further improvements in performance. Distortion is reduced since the operating conditions of the first part of the cascade input can be established independently of the operating conditions of the second part of the cascade input. Furthermore, the load resistor for the first stage along with the grid input of the second or buffer stage provides a more ideal linear load than driving the cathode of the second stage directly. The low impedance of the buffer stage output lowers the distortion of the third stage triode, compared to connecting it directly to the first stage or input triode. In other words it is the accumulative effect of isolation, changed impedances, and different operating currents that provide the additional reduction in distortion.

Figure 5:
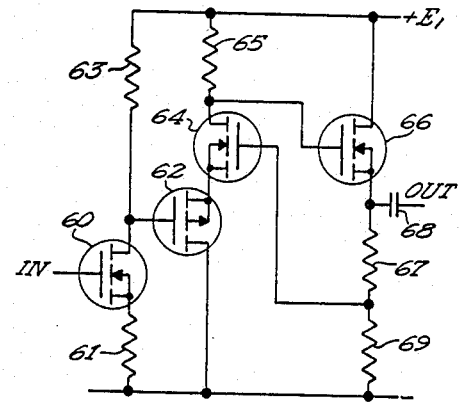
FIG. 5 is a circuit schematic of a fourth embodiment of the present invention.

The disclosed buffered cascode amplifier circuit can also be implemented with solid state transistors. FIG. 5 illustrates an embodiment of the present invention using metal oxide silicon field effect transistors. Referring to FIG. 5 the input signal is received by a first stage transistor 60 whose drain is connected to the gate of a second stage transistor 62. Transistor 62 is a p-channel enhancement mode MOS transistor whose source is connected to the source of a third stage transistor 64 which is an n-channel enhancement mode MOS transistor. The output of transistor 64 is connected to the gate of a fourth stage transistor 66 arranged in a source-follower configuration. The amplifier circuit output signal is taken across voltage divider resistors 67 and 69 through capacitor 68. A portion of the circuit output is fed back to the input of the third stage. The amount of feedback voltage is set by the ratio of the source-follower resistors. The feedback voltage is typically one-fourth to one-sixth of the total output voltage. Resistors 61, 63 and 65 provide biasing or load resistance to ensure the correct operating parameters for the transistor circuit.

With MOS transistors a further benefit emerges due to the availability of both n-channel and p-channel polarities. By using a p-channel transistor for the second or buffer stage in a basic n-channel circuit the current consumption is reduced as the buffer transistor can operate with the same current as the third stage of the cascode input. Therefore, all the buffer stage current can be utilized to drive the third stage transistor rather than sharing it in a common load resistor. Additionally, without a biasing resistor on the second stage transistor 62, distortion is also reduced. During circuit operation the direct current potential at the input of the third stage transistor 64 is raised, allowing a corresponding elevation of the feedback tap for its gate, and providing even lower distortion due to increased negative feedback. The signal gain of the overall circuit is actually increased while distortion is reduced, because the buffer stage allows the first stage transistor 60 to operate more optimally. The combined effects of the addition of a buffer stage is more than would be commonly expected by its inclusion.

What is claimed is:

1. An electron tube cascode-cascade amplifier comprising:
   a cascode input stage including a cascode pair comprising first and second electron tubes, said first tube acting as the signal input tube;
   said input stage including unity gain buffer means fpor connecting the plate of said first tube to the cathode of said second tube through a buffered, unity gain circuit path;
   a cascaded output stage including an output electron tube connected to be driven by the plate output of said second tube; and
   means for connecting said input and output stages to an operating bias.

2. The amplifier according to claim 1 further including feedback bias means for connecting the cathode output of said output tube to the grid of said second tube to provide a dynamic operating bias thereto.

3. A transistorized cascode-cascade amplifier comprising:
   a cascode input stage including a cascode pair comprising first and second transistors, said first transistor acting as the signal input transistor;
   said input stage including unity gain buffer means for connecting the output of said first transistor to the input of said second transistor through a buffered, unity gain circuit path;
   a cascoded output stage including an output transistor connected to be driven by the output of said second transistor; and
   means for connecting said input and output stages to an operating bias.

4. The amplifier according to claim 3 further including feedback bias means for connecting the output of said output transistor to the control terminal of said second transistor to provide a dynamic operating bias thereto.

5. A cascode-cascade amplifier comprising:
   a cascode input stage including a cascode pair comprising first and second amplifying devices, said first device acting as the signal input device;
   said input stage including unity gain buffer means for connecting said cascode pair together throgh a buffered, unity gain circuit path;
   a cascaded output stage including an output amplifying device connected to be driven by the output of said second device; and
   means for connecting said input and output stages to an operating bias.

6. The amplifier according to claim 5 further including feedback bias means for connecting the output of said output device to the control input of said second device to provide a dynamic operating bias thereto.

7. A cascode input stage for an amplifier comprising:
a cascode input stage including a cascode pair comprising first and second amplifying devices, said first device acting as the signal input device;
said input stage including unity gain buffer means for connecting said cascode pair together through a buffered, unity gain circuit path; and
means for connecting said input stage to an operating bias.

* * * * *